(12) United States Patent
Seleznev et al.

(10) Patent No.: US 11,093,825 B2
(45) Date of Patent: Aug. 17, 2021

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventors: Stanislav Seleznev, Round Rock, TX (US); Prateek Sharma, Austin, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/673,167

(22) Filed: Nov. 4, 2019

(65) Prior Publication Data
US 2021/0133550 A1    May 6, 2021

(51) Int. Cl.
| | |
|---|---|
| *G06N 3/063* | (2006.01) |
| *H01L 27/06* | (2006.01) |
| *H01L 21/822* | (2006.01) |
| *G06N 3/04* | (2006.01) |
| *H01L 21/768* | (2006.01) |
| *H01L 29/861* | (2006.01) |
| *H01L 49/02* | (2006.01) |
| *H01L 23/522* | (2006.01) |

(52) U.S. Cl.
CPC .............. *G06N 3/0635* (2013.01); *G06N 3/04* (2013.01); *H01L 21/76877* (2013.01); *H01L 21/8221* (2013.01); *H01L 23/5226* (2013.01); *H01L 27/0688* (2013.01); *H01L 28/20* (2013.01); *H01L 29/861* (2013.01)

(58) Field of Classification Search
CPC .... G06N 3/0635; G06N 3/04; H01L 23/5226; H01L 21/8221; H01L 21/76877; H01L 28/20; H01L 29/861; H01L 27/0688
USPC .......................................................... 706/33
See application file for complete search history.

(56) References Cited

U.S. PATENT DOCUMENTS

| | | | |
|---|---|---|---|
| 2015/0028407 A1* | 1/2015 | Luo ................... | H01L 29/66181 257/300 |
| 2016/0364643 A1 | 12/2016 | Cruz-Albrecht et al. | |
| 2017/0193357 A1 | 7/2017 | Lee | |
| 2018/0165573 A1* | 6/2018 | Hsu ...................... | G06N 3/0454 |
| 2018/0174030 A1* | 6/2018 | Hsu .......................... | G06N 3/08 |

OTHER PUBLICATIONS

Kunihiko Fukushima, "Neocognitron: A Self-organizing Neural Network Model for a Mechanism of Pattern Recognition Unaffected by Shift in Position," Biological Cybernetics, vol. 36, pp. 136-202, 1980.
Akifumi Kawahara et al., "An 8 Mb Multi-Layered Cross-Point ReRAM Macro With 443 MB/s Write Throughput," IEEE Journal of Solid-State Circuits, vol. 48, No. 1, Jan. 2013, pp. 178-185.
G. Tallarida et al., "Low temperature rectifying junctions for crossbar non-volatile memory devices," IEEE 978-1-4244-3761-0/09, 2009, 3 pages.

* cited by examiner

*Primary Examiner* — Vu A Vu
(74) *Attorney, Agent, or Firm* — Robert F. Hightower (57) ABSTRACT

In an embodiment, a method of forming a neural network circuit may include forming a dielectric layer overlying a semiconductor substrate that has active devices formed in the semiconductor substrate. An opening may be formed in the dielectric layer, and a series connected resistor and diode may be formed within the opening.

17 Claims, 3 Drawing Sheets

FIG. 5 ant text-align: center;">US 11,093,825 B2

METHOD OF FORMING A SEMICONDUCTOR DEVICE

BACKGROUND

The present invention relates, in general, to electronics, and more particularly, to semiconductors, structures thereof, and methods of forming semiconductor devices.

In the past, various methods and structures were utilized to form neuromorphic systems. These neuromorphic systems generally included a digital processing computer, a memory storage device such as a random access memory, a neural network, and other associated computer architectural components. The digital processing computer accessed the memory storage device in order to retrieve settings information. The digital computer also read information from the neural network and processed the information using computer algorithms and other information from the memory storage device.

These neuromorphic systems generally were slow to react to input signals because of the computational time required for the computer to access the memory storage device and to access the neural network, and the time required for the computer to execute the algorithms using the information from the neural network.

The neuromorphic systems were also expensive because of the space required to form the digital computer architecture including the memory storage device and the digital processing computer.

Accordingly, it is desirable to have a neuromorphic system that processes information faster, that has lower cost, or that occupies less space on a semiconductor device.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION

Figure 1:
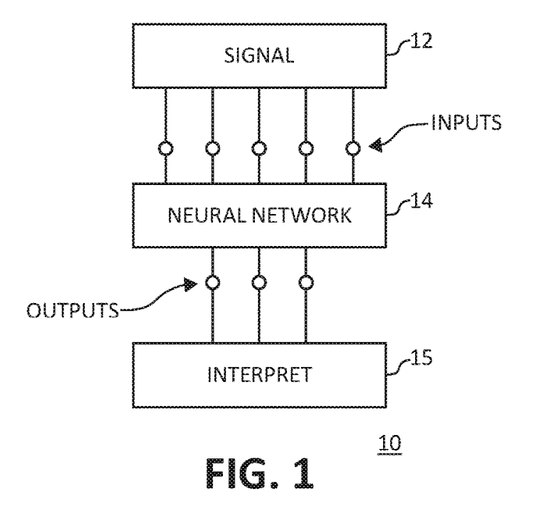
FIG. 1 illustrates in a general manner, an example of a portion of a neuromorphic system that includes a neural network circuit in accordance with the present invention.

FIG. 1 illustrates in a general manner, an example of a portion of a neuromorphic system 10 that includes a neural network circuit 14. System 10 includes a signaling device or signal circuit 12 that receives an external stimulus such as light or sound, etc., and creates an electrical signal that is representative of the external stimulus. Signal circuit 12 provides the electrical signal to circuit 14 which processes the electrical signal to form electrical output signals that identify the information formed by the external stimulus. An interpret circuit 15 receives the electrical output signals from circuit 14 and forms an image or signal that can be interpreted by a user of system 10.

Figure 2:
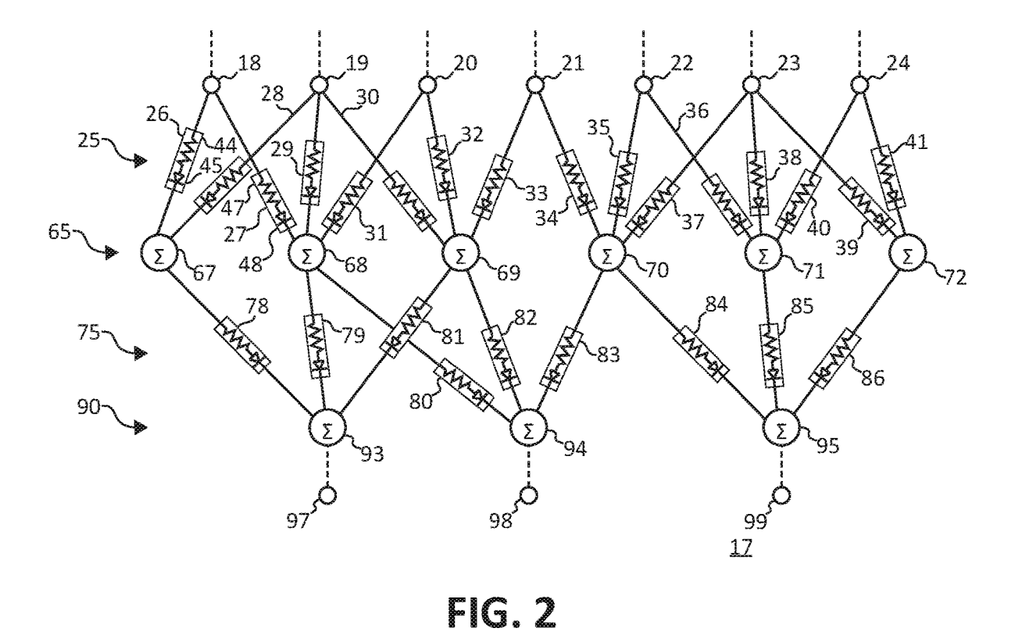
FIG. 2 schematically illustrates an example of a portion of an embodiment of a neural network circuit that may have an embodiment that may be an alternate embodiment of the neural network circuit of FIG. 1 in accordance with the present invention.

FIG. 2 schematically illustrates an example of a portion of an embodiment of a neural network or neural network circuit 17 that may have an embodiment that may be an alternate embodiment of circuit 14 of FIG. 1. Circuit 17 includes a plurality of inputs 18-24 that are configured to receive an electrical signal from a signaling device such as for example from circuit 12 of FIG. 1. Circuit 17 also includes a first synapse level 25 that includes a first plurality of synapses or synapse circuits 26-41. At least some of circuits 26-41 may be configured to receive one of the input signals, and an embodiment may include that each of circuits 26-41 are configured to receive an input signal from one or more of inputs 18-24. Circuit 17 also includes a first accumulate (MAC) level 65 that includes a plurality of accumulate (MAC) circuits 67-72. Each of circuits 67-72 are configured to receive an output from one or more of circuits 26-41, and some of circuits 67-72 may be configured to receive an output from two or more of circuits 26-41.

An embodiment of circuit 17 may include a second synapse level 75 that includes a plurality of synapses or synapse circuits 78-86 that each are configured to receive an input from outputs of circuits 67-72.

In an embodiment, circuit 17 may also include a second accumulate (MAC) level 90 that includes a plurality of MAC circuits 93-95. Circuits 93-95 may be configured to receive an output from one of circuits 78-86, and an embodiment may include that at least one of circuits 93-95 may be configured to receive an output from two or more of circuits 78-86.

Each of synapse circuits 26-41 and 78-86 includes a resistor connected in series with a diode. For example, circuit 26 may include a resistor 44 that is connected in series with a diode 45, and circuit 27 may include a resistor 47 connected in series with a diode 48. As will be seen further hereinafter, an embodiment may include that each resistor of circuits 26-41 and 78-86 has a substantially fixed value but the value of any of the resistors may be different from the value of another of the resistors. For example, resistor 44 may have a fixed resistance that is different from the fixed resistance of resistor 47. An embodiment may include that some of the resistors may have substantially the same value. An embodiment may include that each of circuits 67-72 and 93-95 may be a conductor that connects together an output of two or more of respective circuits 26-41 and 78-86. For example, circuit 68 may have an embodiment as a conductor that directly connects the outputs of circuits 27, 29, and 31 to each other.

In an embodiment, each synapse or synapse circuit of synapse levels 25 and 75 receives a signal and multiplies the signal by a weight of the synapse. An embodiment may include that the weight of a synapse, or synaptic weight, may be the conductance due to the elements therein. An embodiment may include that the weight of each synapse is the inverse of the resistance of the resistor of the synapse. For example, the weight of synapse or synapse circuit 26 may be a value of one divided by the value of resistor 44 (1/R44).

In an embodiment, each of circuits 67-72 and 93-95 may be configured to sum together the values of the signals on the outputs that are connected to circuits 67-72 and 93-95. For example, assume that each of inputs 18-24 receives an electrical signal. In some embodiments the input signals may be analog signals from circuit 12 (FIG. 1). Input 18 is connected to an input of circuit 26 and to an input of circuit 27. Synapse 26 multiplies the input signal by the weight of synapse 26 and synapse circuit 27 multiplies the input signal by the weight of synapse 27. The value of the signal on input 18 causes a current to flow through resistor 44 and diode 45 to circuit 67. The input signal also causes another current to flow through resistor 47 and diode 48 to circuit 68. In an embodiment, the value of resistor 44 may be the different from the value of resistor 47, thus, different values of current may flow through circuits 26 and 27.

Similarly, the signal received on input 19 causes a current to flow through circuit 28 to circuit 67, causes another current to flow through circuit 29 to circuit 68, and causes a third current to flow through circuit 30 to circuit 69.

The current from circuit 26 and the current from circuit 28 are summed together by circuit 67, and the current from circuits 27, 29, and 31 are summed together at circuit 68. Thus, circuit 68 sums together currents from circuits 27, 29, and 31, circuit 69 sums together currents from circuits 30, 32, and 33, circuit 70 sums together currents from circuits 34, 35, and 37, circuit 71 sums together currents from circuits 36, 38, and 40, and circuit 72 sums together currents from circuits 39 and 41. Consequently, circuits 67-72 accumulate the results of the input signals multiplied by the weights of the respective synapses.

The output signals formed by circuits 67-72 become an input signal to circuits 78-86. Circuit 78 receives the output signal from circuit 67, circuits 79-80 receive the output signal from circuit 68, circuits 81-82 receive the output signal from circuit 69, circuits 83-84 receive the output signal from circuit 70, circuit 85 receives the output signal from circuit 71, and circuit 86 receives the output signal from circuit 72.

Circuits 93-95 receive the output signals, such as for example currents, from circuits 78-86 and form respective output signals on outputs 97-99. Circuit 93 receives the output, such as for example the current, from circuits 78-79 and 81 and sums them together to form an output signal on output 97. Circuit 94 sums together the output signals, such as for example the currents, from circuits 80 and 82-83 to form an output signal on output 98, and circuit 95 sums together the output signals, such as for example the currents, from circuits 84-86 to form an output signal on output 99.

Consequently, circuits 93-95 accumulate the results of the input signals to synapses 78-86 multiplied by the weights of the respective synapses.

Those skilled in the art will appreciate that the input signals received at inputs 18-24 may be analog signals and the signals formed by the circuits of circuit 17 may also be analog signals. However, some embodiments may include that the signals received at inputs 18-24 may be digital signals and the signals formed by circuit 17 may be representative of digital signals. For example, the currents formed by the circuits of circuit 17 may represent a digital value.

Figure 3:
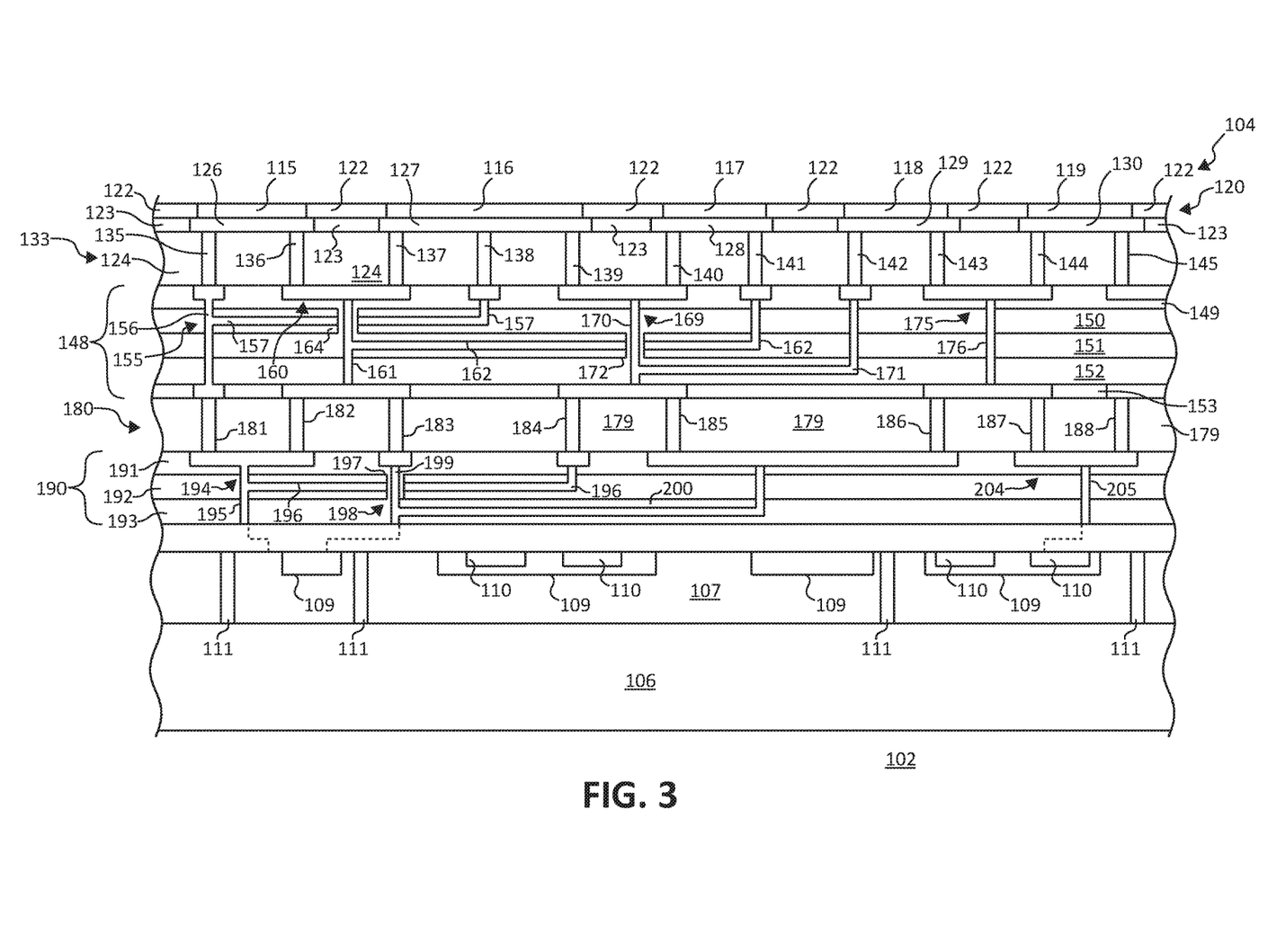
FIG. 3 illustrates an enlarged cross-sectional portion of an example of an embodiment of a semiconductor device that includes an example of an embodiment of a neural network circuit that may have an embodiment that may be an example of an embodiment of the neural network circuit of FIG. 2 in accordance with the present invention.

FIG. 3 illustrates an enlarged cross-sectional portion of an example of an embodiment of a semiconductor device 102 that includes a neural network circuit 104 that may have an embodiment that may be an example of an embodiment of a physical implementation of circuit 17 of FIG. 2. Device 102 includes a semiconductor substrate 106 that has a doped region or doped layer 107 formed on or in substrate 106. Doped regions 109 and 110 may be formed within region 107 to form active regions of active semiconductor devices such as transistors or diodes or alternately portions of passive semiconductor elements and circuits. An embodiment of device 102 may also include isolation regions 111 formed in region 107 to isolate certain portions of active regions and active elements from each other. Neural network circuit 104 is formed on or alternately overlying substrate 106 and region 107. In an embodiment, the output signals from circuit 104 may be coupled to different active portions of device 102.

Circuit 104 includes inputs 115-119 that may have an embodiment that may be an alternate embodiment of respective inputs 18-22 of FIG. 2. Circuit 104 also includes a first synapse level 133 that may have an embodiment that may be substantially similar to level 25 of FIG. 2. First synapse level 133 includes a dielectric layer 124 and synapse vias 135-145 that are formed within, and in an embodiment through, layer 124. The dielectric layer or layers and the openings therein for vias 135-145 may be formed using well-known semiconductor manufacturing techniques. Each of vias 135-145 may have a synapse circuit formed within the via. For example, circuits 26-27 may be formed within respective vias 135-136, circuits 28-30 may be formed within respective vias 138, 137, and 139, circuits 31-32 may be formed within respective vias 141 and 140, circuits 33-34 may be formed within respective vias 142-143, and circuits 35-36 may be formed within respective vias 144-145. Those skilled in the art will appreciate that all of the FIG. 2 synapse circuits are not shown in FIG. 3 for simplicity of the drawings. Thus, circuits 37-41 (FIG. 2) are not shown in FIG. 3.

An embodiment of circuit 104 may also include an input layer 120 that is utilized to route the input signals from inputs 115-119 to the synapse circuits that are formed in vias 135-145. Layer 120 includes dielectric layers 122-123 and routing conductors 126-130. Conductors 126-130 are used to connect the synapse circuits to receive the input signals from inputs 115-119. For example, input 115 is connected to routing conductor 126 that is connected to the inputs of the synapse circuits within vias 135 and 136. Similarly, input 116 is connected to routing conductor 127 that is connected to the inputs of the synapse circuits within vias 137-139 to connect the synapse circuits to receive the input signals. In a similar manner, input 117 is connected to routing conductor 128 that is connected to the inputs of the synapse circuits within the vias 140 and 141. Additionally, input 118 is connected to a routing conductor 129 that is connected to the inputs of the synapse circuits within vias 142-143 to connect the synapse circuits to receive the input signals from input 118. Further, input 119 is connected to a routing conductor 130 that is connected to the inputs of the synapse circuits within vias 144-145 to connect the synapse circuits to receive the input signals from input 119.

Those skilled in the art will appreciate that in other embodiments fewer dielectric layers and conductors may be required to route the input signal from the input to the synapse circuits within vias 135-145.

Circuit 104 also includes a MAC level 148 that may have an embodiment that may be an alternate embodiment of level 65 of FIG. 2. Level 148 may include MAC circuits 155, 160, 169, and 175 that may have an embodiment that may be an alternate embodiment of circuits 67, 68, 69, and 70, respectively. Level 148 includes a dielectric layer, or alternately a plurality of dielectric layers, on which conductors are formed to interconnect the outputs of circuits 26-41. In an embodiment, circuits 67-72 may each be a separate conductor. The conductor may be a metal conductor or a conductor of doped polysilicon, or a conductor of a silicide or a salacide material, or other well-known conductor materials. The dielectric layer or layers and the conductors for circuits 155, 160, 169, and 175 may be formed using well-known semiconductor manufacturing techniques.

Those skilled in the art will appreciate that in order to illustrate the routing and interconnectivity, level 148 is illustrated as a plurality of dielectric layers 149-153 that have conductors formed thereon in order to illustrate routing and interconnections to the circuits within the vias of level 133. However, those skilled in the art will understand that the routing may be accomplished using one dielectric layer with conductors routed across the dielectric layer. Thus, layers 149-153 can be considered as one dielectric layer with multiple separate conductors.

Consequently, in order illustrate the routing and interconnectivity, circuit 155 is illustrated to include a vertical conductor portion 156 that connects to via 135 and to the output of circuit 26, and to have a horizontal conductor portion 157 that routes circuit 155 to connect to via 138 and to the output of circuit 28 thereby connecting the outputs of vias 135 and 138 (and the outputs of circuits 26 and 28) together. Similarly, circuit 160 includes a vertical connector portion 161 that electrically connects to vias 136-137 and to the outputs of respective circuits 27 and 29, and a lateral routing conductor portion 162 that provides interconnection to via 141 and to the output of circuit 31 thereby connecting the outputs of vias 136, 137, and 141 (and the outputs of circuits 27, 29, and 31) together. Circuit 160 is also illustrated to include a via portion 164 with a dielectric within the via that isolates circuit 160 from the routing portion 157 of circuit 155. Similarly, circuit 169 is illustrated to have a vertical connector portion 170 that connects to vias 139 and 140 and to the outputs of circuits 30 and 32, and a lateral routing conductor portion 171 that connects to via 142 and the output of circuit 33 thereby connecting the outputs of circuits 30 and 32-33 together. Circuit 169 is also illustrated to include a via portion 172 with a dielectric within the via that isolates circuit 169 from the routing portion 162 of circuit 160. Circuit 175 includes conductor 176 that connects to vias 143-144 and to the outputs of circuits 34-35 thereby connecting the outputs of vias 143-144 (and the outputs of circuits 34-35) together. Those skilled in the art will appreciate that the multiple dielectric layers are illustrated to illustrate the interconnections and in other embodiments the connections may be accomplished using a single dielectric layer instead of the multiple dielectric layers 149-153.

An embodiment of circuit 104 may also include a second synapse level 180 that may have an embodiment that may be an alternate embodiment of level 75 of FIG. 2. Second synapse level 180 includes a dielectric layer 179 and synapse vias 181-188 that are formed within and in an embodiment through, layer 179. Each of vias 181-188 may have a synapse circuit formed within the via. For example, circuit 78 may be formed within via 181, circuits 79-80 may be formed within respective vias 182-183, circuits 81-82 may be formed within respective vias 184-185, circuits 83-85 may be formed within respective vias 186-188, etc. The dielectric layer or layers and the openings therein for vias 181-188 may be formed using well-known semiconductor manufacturing techniques. Those skilled in the art will appreciate that all of the level 75 synapse circuits of FIG. 2 are not shown in level 180 for simplicity of the drawings, thus, circuit 86 (FIG. 2) is not shown in FIG. 3.

In an embodiment, circuit 104 may also include a second MAC level 190 that may have an embodiment that may be an alternate embodiment of level 90 of FIG. 2. Level 190 may include MAC circuits 194, 198, and 204 that may have an embodiment that may be an alternate embodiment of circuits 93-95, respectively. Level 190 includes a dielectric layer, or alternately a plurality of dielectric layers, on which conductors are formed to interconnect the outputs of circuits 78-86. In an embodiment, circuits 93-95, or alternately respective circuits 194, 198, and 204, may each be a separate conductor. The conductor may be a metal conductor or a conductor of doped polysilicon, or a conductor of a silicide or a salacide material, or other well-known conductor materials. The dielectric layer or layers and the conductors for circuits 93-95, or alternately respective circuits 194, 198, and 204, may be formed using well-known semiconductor manufacturing techniques.

Those skilled in the art will appreciate that in order to illustrate the routing and interconnectivity, level 190 is illustrated as a plurality of dielectric layers 191-193 that have conductors formed thereon in order to illustrate routing and interconnections to the circuits within the vias of level 190. However, those skilled in the art will understand that the routing may be accomplished using one dielectric layer with conductors routed across the dielectric layer. Thus, layers 191-193 can be considered as one dielectric layer with multiple separate conductors.

Consequently, in order to illustrate the routing and interconnectivity provided by level 190, circuit 194 is illustrated to include a vertical conductor portion 195 that connects to the output of vias 181 and 182 and the outputs of circuits 78-79, to have a horizontal conductor portion 196 that routes circuit 194 to the output of via 184 and to the output of circuit 81, thereby connecting the outputs of vias 181-182 and 184 (and the outputs of circuits 78-79 and 81) together. Similarly, circuit 198 includes a vertical connector portion 199 that electrically connects to the output of via 183 and to the output of circuit 80, and a lateral routing conductor portion 200 that provides interconnection to the output of vias 185 and 186 and to the outputs of circuits 82-83 thereby connecting the outputs of vias 183 and 185-186 (and the outputs of circuits 80 and 82-83) together. Circuit 198 is also illustrated to include a via portion 197 with a dielectric within portion 197 that isolates circuit 198 from the routing portion 196 of circuit 194. Similarly, circuit 204 is illustrated to have a vertical connector portion 205 that connects to the outputs of vias 187-188 and the outputs of circuits 84-85 thereby connecting the outputs of vias 187-188 (and the outputs of circuits 84-85) together. Those skilled in the art will appreciate that the multiple dielectric layers are illustrated to show the routing interconnections and in other embodiments the routing connectors may be accomplished using a single dielectric layer instead of the multiple dielectric layers 191-193.

In an embodiment, circuits 194, 198, and 204 may form the output signals of circuit 104. Thus, circuits 194, 198, and 204 may be connected to active and/or passive circuits of device 102. For example, one or more of circuits 194, 198, and 204 may be connected to the active circuits of layer 107 to provide input signals to the active devices of layer 107, as illustrated in a general manner by dashed lines.

Those skilled in the art will appreciate that a digital computer processor or digital arithmetic unit is not required or used in forming the output signals of circuit 17, thus, circuit 17 has a very fast response time to an input signal that is received at the inputs. Since no digital computer is used, there is no need for a computer memory circuit to store synapse weights or data or programs, thereby further reducing costs and improving the response time. Not using a digital computer also reduces the amount of area that is used on the semiconductor device thereby lowering the cost. Additionally, the synapse circuits of circuit 17 are not formed in an X-Y matrix, thus, no select transistors or switching elements are required to select row lines and column lines of an X-Y matrix. This also lowers the cost of circuit 17. Since each synapse circuit has a resistor with a fixed resistance, there is no need for a digital computer to read data from the synapse circuit which also improves the response time and reduces costs.

Because the weight of each synapse is a fixed value, the weights can not be changed once circuit 17 has been created in a physical form. Thus, circuit 17 is applicable for inferencing applications, but circuit 17 can not be used for backpropagation.

Figure 4:
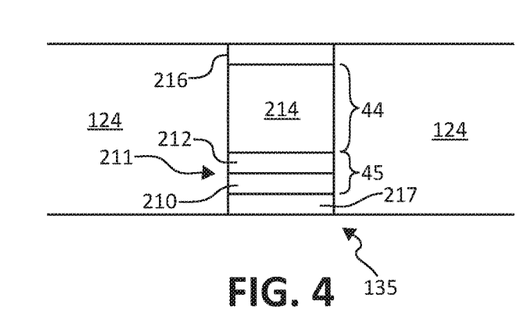
FIG. 4 illustrates an enlarged cross-sectional portion of an example of an embodiment of a via that may be an example of a portion of the circuit of FIG. 3 in accordance with the present invention.

FIG. 4 illustrates an enlarged cross-sectional portion of an example of an embodiment of via 135 and of circuit 26 formed therein. Layer 124 may be formed on or alternately overlying substrate 106. An opening may be formed through layer 124. Diode 45 may be formed within the opening. For example, a layer 210 of doped polysilicon may be formed within the opening and another layer 212 of doped polysilicon may be formed on layer 210. Layer 210 and 212 may be doped with opposite conductivity types in order to form a junction 211 near or at an interface of layers 210 and 212. Resistor 44 may also be formed within the opening of via 135. For example, an additional layer 214 of doped polysilicon can be formed on layer 212 to form resistor 44. Layer 212 can be doped with the same conductivity type as layer 212 and with a doping concentration that provides the resistance desired for resistor 44. In an embodiment, conductor materials 217 and 216 may be formed at opposite ends of the opening of via 135 to provide an easy electrical connection to circuit 26. The dielectric layers of device 102 and the materials within the opening may be formed by well-known semiconductor manufacturing techniques including atomic layer deposition.

Those skilled in the art will appreciate that resistor 44 and diode 45 may be formed from other materials. For example, an embodiment of diode 45 may be formed from silicon nitride in contact with a conductor. The conductor may be tantalum nitride ($Ta_xN_y$) or other known materials that form the junction of the diode. An embodiment may include forming diode 45 from zinc-oxide (ZnO) in contact with a conductor. The conductor may be silver (Ag) or gold (Au) or a combination of gold and titanium (AuTi). In an embodiment, the material(s) of diode 45 may form a Schottky diode. Resistor 44 may have an embodiment that is formed from nickel-oxide (NiO) in contact with a conductor. The conductor may be gold (Ag) or platinum (Pt) or other well know material(s) that form a diode with nickel-oxide. An embodiment of the resistor may be formed from tantalum-oxide ($TaO_x$) or other equivalent materials. An example of an embodiment may include that NiO or $TaO_x$ may be sandwiched between two conductors. In an embodiment, circuit 17 may be formed using materials in a semiconductor back-end-of-line (BEOL) processing facility and from methods used therein. An embodiment may include that some of the resistor materials, alone or in combination, may have a changeable state. However, an embodiment of circuit 10, and/or circuit 17, may be formed without (or devoid of) a circuit to program or change the state of the materials. Thus, the state is set or established or programmed one time during the manufacturing process. Consequently, the value thereof is still fixed. For example, a current or voltage pulse may be applied by the BEOL method or manufacturing process.

Figure 5:
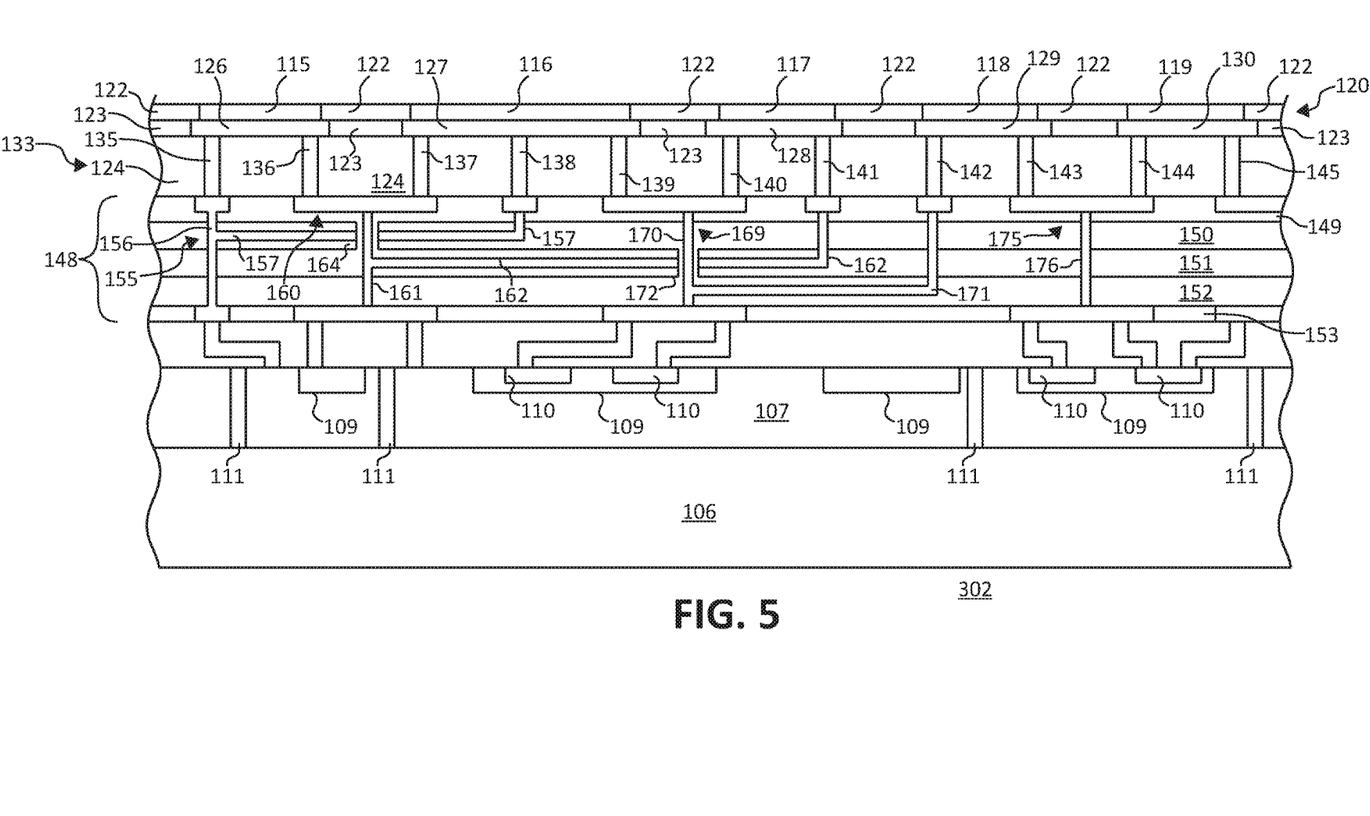
FIG. 5 illustrates an enlarged cross-sectional portion of an example of an embodiment of a semiconductor device that may have an embodiment that may be an alternate embodiment of the device of FIG. 2 or FIG. 3 in accordance with the present invention.

FIG. 5 illustrates an enlarged cross-sectional portion of an example of an embodiment of a semiconductor device 302 that includes at least a portion of a neural network circuit that may have an embodiment that may be an alternate embodiment of device 102 of FIG. 2. Device 302 has a single synapse level 133 and a single accumulate level 148 instead of the multiple synapse levels and accumulate levels of device 102. In an embodiment, circuits 155, 160, 169, and 175 may form the output signals of circuit 302. Thus, circuits 155, 160, 169, and 175 may be connected to active and/or passive circuits of device 302. For example, one or more of circuits 155, 160, 169, and 175 may be connected to the active circuits of layer 107 to provide input signals thereto, as illustrated in a general manner by the lines from circuit 155 to region 107, from circuit 164 to regions 109 and 107, from circuit 169 to regions 110, and from circuit 175 to regions 110.

Those skilled in the art will appreciate that an embodiment of a method of forming a semiconductor device having a neural network may comprise:

providing a semiconductor substrate, such as for example substrate 106, having a doped layer, such as for example layer 107, formed thereon, the doped layer having a plurality of doped regions, such as for example regions 109/110, that are portions of active regions of the semiconductor device;

forming a first dielectric layer, such as for example layer 134, overlying the doped layer;

forming a plurality of first synapse circuits in the first dielectric layer including forming a plurality of vias in the first dielectric layer, and forming a first synapse circuit, such as for example one of circuits 135-145, within each first via wherein each first synapse circuit includes a first diode connected in series with a resistor having a substantially fixed resistance;

forming an input of each first synapse circuit to receive an input signal of a plurality of input signals;

forming a second dielectric layer, such as for example layers 149-152, underlying the first dielectric layer, the second dielectric layer including a plurality of first accumulation nodes, such as for example nodes 155/160/169, wherein each first accumulation node is connected to receive an output signal from two or more of the first synapse circuits; and forming a third dielectric layer, such as for example layer 179, underlying the second dielectric layer; and forming a plurality of second vias, such as vias 181-188, in the third dielectric layer, and forming a second synapse circuit, such as for example one of the circuits in vias 181-188, within each second via wherein each second synapse circuit includes a second diode directly connected in series with a second resistor having another substantially fixed resistance wherein each first accumulation node is connected to an input of two or more second synapse circuits.

An embodiment may include forming the second dielectric layer includes forming each first accumulation node as a conductor.

The method may have an embodiment that may include forming a first conductor connected to an output of a first one of the plurality of first synapse circuits and to an output of a second one of the plurality of first synapse circuits.

In an embodiment, the method may include forming a second conductor commonly connected directly to an output of a third one of the plurality of first synapse circuits and to an output of a fourth one of the plurality of first synapse circuits.

An embodiment may include forming a first metal conductor directly connected to an output of two or more of the plurality of first synapse circuits, and forming a second metal conductor directly connected to an output of the different two or more of the plurality of first synapse circuits.

The method may have an embodiment that may include forming the first resistor from doped polysilicon.

An embodiment may include forming the diode from doped polysilicon material.

The diode may be formed using atomic layer deposition in an embodiment.

Another embodiment may include forming a conductor within one of the plurality of first vias wherein the conductor directly connects the first synapse circuit to receive the input signal.

Those skilled in the art will also appreciate that an embodiment of a neural network circuit may comprise:

two or more inputs, such as for example inputs 19-20, wherein a first input receives a first input signal and a second input receives a second input signal;

a first set of two or more synapse circuits, such as for example circuits 29-31, connected to receive the first input signal and a second set of two or more synapse circuits, such as for example circuits 36-37, connected to receive the second input signal wherein each of the first set of two or more synapse circuits and the second set of two or more synapse circuits each include a substantially fixed value resistor connected in series with a diode;

a first accumulation node, such as for example node 68, connected to receive a first output signal from a first synapse, such as for example circuit 30, of the first set of two or more synapse circuits and to receive a second output signal from a second synapse, such as for example circuit 36, of the second set of two or more synapse circuits, the first accumulation node configured to add the first output signal to the second output signal to form a first accumulation signal wherein the first accumulation node is a conductor; and a second accumulation node, such as for example node 69, connected to receive a third output signal from a third synapse circuit, such as for example circuit 31, of the first set of two or more synapse circuits and to receive a fourth output signal from a fourth synapse circuit, such as for example circuit 37, of the second set of two or more synapse circuits, the second accumulation node configured to add the third output signal to the fourth output signal to form a second accumulation signal.

An embodiment may include a third set of two or more synapse circuits, such as for example circuits 79-80, connected to receive the first accumulation signal and a fourth set of two or more synapse circuits, such as for example circuits 81-82, connected to receive the second accumulation signal wherein each of the third set of two or more synapse circuits and the fourth set of two or more synapse circuits each include a substantially fixed value resistor connected in series with a diode.

In an embodiment, the circuit may include a third accumulation node, such as for example node 93, connected to receive a fifth output signal from a fifth synapse, such as for example at node 79, of the third set of two or more synapse circuits and to receive a sixth output signal from a sixth synapse, such as for example circuit 81, of the fourth set of two or more synapse circuits, the third accumulation node configured to add the fifth output signal to the sixth output signal to form a third accumulation signal.

An embodiment may include a fourth accumulation node, such as for example node 94, connected to receive a seventh output signal from a seventh synapse, such as for example circuit 80, of the third set of two or more synapse circuits and to receive an eighth output signal from an eighth synapse, such as for example circuit 82, of the fourth set of two or more synapse circuits, the third accumulation node configured to add the seventh output signal to the eighth output signal to form a fourth accumulation signal.

In an embodiment the circuit may include that the first set of two or more synapse circuits and the second set of two or more synapse circuits are formed within vias that are in a first dielectric layer.

In an embodiment, the first accumulation node and the second accumulation node may be formed on a second dielectric layer that underlies the first dielectric layer.

An embodiment may include that the third synapse circuit and the fourth synapse circuit may be formed within vias that are in a third dielectric layer that underlies the second dielectric layer.

Those skilled in the art will appreciate that an embodiment of a method of forming a neural network may comprise:

forming a first dielectric layer, such as for example layer 191, overlying a semiconductor substrate, such as for example substrate 106 and/or layer 107, that has a plurality of active semiconductor devices formed in the semiconductor substrate;

forming a first plurality of accumulation node conductors, such as for example conductors 193/199, on the first dielectric layer;

forming a second dielectric layer, such as for example layer 179, overlying the first dielectric layer;

forming a plurality of first vias, such as for example vias 182-185, in the second dielectric layer; and forming a first circuit within each plurality of first vias including forming each first circuit to include a diode, such as for example a diode of synapse 78, in series with a resistor and forming each resistor having a substantially fixed resistance.

The method may have an embodiment that may include forming a first diode and a first resistor, such as for example the resistor in vias 181, within a first via, such as for example the via 181, of the plurality of first vias and forming a second diode and a second resistor, such as for example the resistor in via 183, within a second via, such as for example via 183, of the plurality of first vias wherein the first resistor has a different value from the second resistor.

The method may have an embodiment that may include forming one of the first resistor or the first diode directly connected to a first accumulation node conductor, such as for example conductor 193 or 93, of the first plurality of accumulation node conductors, and forming one of the second resistor or the second diode directly connected to a second accumulation node conductor, such as for example conductor 199 or 98, of the first plurality of accumulation node conductors.

An embodiment may include forming a first accumulation node conductor to substantially simultaneously receive output signals from a first set of two or more first circuits and forming a second accumulation node conductor to receive different output signals from a second set of two or more first circuits.

In view of all of the above, it is evident that a novel device and method is disclosed. Included, among other features, is forming a neural network and synapse circuits there of that directly accumulates the output signals of the synapse circuits. Additionally, each synapse circuit receives an input signal and directly forms the corresponding output signal which assists in reducing the response time of the neural network circuit. Not using a digital computer or digital arithmetic unit reduces the cost and improves the response time of the neural network.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a semiconductor device having a neural network comprising:

providing a semiconductor substrate having a doped layer formed thereon, the doped layer having a plurality of doped regions that are portions of active regions of the semiconductor device;

forming a first dielectric layer overlying the doped layer;

forming a first plurality of vias through the first dielectric layer;

forming a first synapse circuit within the first plurality of vias including forming within the first plurality of vias a first diode connected in series with a resistor having a substantially fixed resistance;

forming an input of each first synapse circuit to receive an input signal of a plurality of input signals;

forming a second dielectric layer underlying the first dielectric layer;

forming a second plurality of vias within the second dielectric layer;

forming a first conductor within the second plurality of vias to form a plurality of first accumulation nodes wherein the first conductor is connected to receive an output signal from two or more of the first synapse circuits;

forming a third dielectric layer underlying the second dielectric layer;

forming a third plurality of vias in through the third dielectric layer; and forming a second synapse circuit within each of the third plurality of vias including forming within the third plurality of vias a second diode and a second resistor wherein the second resistor has another substantially fixed value and wherein the second diode is directly connected in series with the second resistor and wherein the first conductor is connected to an input of two or more of the second synapse circuits.

2. The method of claim 1 wherein forming the first conductor includes forming the first conductor connected to an output of a first one of the two or more first synapse circuits and to an output of a second one of the plurality two or more first synapse circuits.

3. The method of claim 2 further including forming a second conductor commonly connected directly to an output of a third one of the two or more first synapse circuits and to an output of a fourth one of the two or more first synapse circuits.

4. The method of claim 1 wherein forming the first conductor includes forming a first metal conductor directly connected to an output of two or more of the first synapse circuits, and forming a second metal conductor directly connected to an output of a different two or more of the first synapse circuits.

5. The method of claim 1 wherein forming the first plurality of vias includes forming the first resistor from doped polysilicon.

6. The method of claim 5 further including forming the diode from doped polysilicon material.

7. The method of claim 5 further including forming the diode using atomic layer deposition.

8. The method of claim 1 wherein forming the first synapse circuit includes forming a conductor within one of the first plurality of vias wherein the conductor directly connects the first synapse circuit to receive the input signal.

9. A neural network circuit comprising:
two or more inputs wherein a first input receives a first input signal and a second input receives a second input signal;
a first set of two or more synapse circuits connected to receive the first input signal and a second set of two or more synapse circuits connected to receive the second input signal wherein each of the first set of two or more synapse circuits and the second set of two or more synapse circuits each include a substantially fixed value resistor connected in series with a diode;
a first dielectric layer having two or more openings formed through the first dielectric layer and a first conductor formed filling a first opening of the two or more openings to provide a conduction path through the first dielectric layer, the first conductor forming a first accumulation node connected to receive a first output signal from a first synapse circuit of the first set of two or more synapse circuits and to receive a second output signal from a second synapse circuit of the second set of two or more synapse circuits, the first accumulation node configured to add the first output signal to the second output signal to form a first accumulation signal wherein the first accumulation node is a conductor; and
a second conductor formed filling a second opening of the two or more openings to provide a conduction path through the first dielectric layer, the second conductor forming a second accumulation node connected to receive a third output signal from a third synapse circuit of the first set of two or more synapse circuits and to receive a fourth output signal from a fourth synapse circuit of the second set of two or more synapse circuits the second accumulation node configured to add the third output signal to the fourth output signal to form a second accumulation signal.

10. The neural network circuit of claim 9 further including a third set of two or more synapse circuits connected to receive the first accumulation signal and a fourth set of two or more synapse circuits connected to receive the second accumulation signal wherein each of the third set of two or more synapse circuits and the fourth set of two or more synapse circuits each include a substantially fixed value resistor connected in series with a diode.

11. The neural network circuit of claim 10 further including a third accumulation node connected to receive a fifth output signal from a fifth synapse circuit of the third set of two or more synapse circuits and to receive a sixth output signal from a sixth synapse circuit of the fourth set of two or more synapse circuits the third accumulation node configured to add the fifth output signal to the sixth output signal to form a third accumulation signal.

12. The neural network circuit of claim 11 further including a fourth accumulation node connected to receive a seventh output signal from a seventh synapse circuit of the third set of two or more synapse circuits and to receive an eighth output signal from an eighth synapse circuit of the fourth set of two or more synapse circuits the third accumulation node configured to add the seventh output signal to the eighth output signal to form a fourth accumulation signal.

13. The neural network circuit of claim 9 wherein the first set of two or more synapse circuits and the second set of two or more synapse circuits are formed within openings that are in a third dielectric layer.

14. The neural network circuit of claim 13 wherein the third synapse circuit and the fourth synapse circuit are formed within openings that are in a fourth dielectric layer that underlies the second dielectric layer.

15. A method of forming a neural network comprising:
forming a first dielectric layer overlying a semiconductor substrate that has a plurality of active semiconductor devices formed in the semiconductor substrate;
forming a first plurality of accumulation node conductors on the first dielectric layer;
forming a second dielectric layer overlying the first dielectric layer;
forming a plurality of first vias in the second dielectric layer; and
forming a first circuit within each plurality of first vias including forming a first diode in series with a first resistor within a first via of the plurality of first vias and forming a second diode in series with a second resistor within a second via of the plurality of first vias and forming each resistor having a substantially fixed resistance wherein the first resistor has a different value from the second resistor.

16. The method of claim 15 further including forming one of the first resistor or the first diode directly connected to a first accumulation node conductor of the first plurality of accumulation node conductors, and forming one of the second resistor or the second diode directly connected to a second accumulation node conductor of the first plurality of accumulation node conductors.

17. The method of claim 15 further including forming a first accumulation node conductor to substantially simultaneously receive output signals from a first set of two or more first circuits and forming a second accumulation node conductor to receive different output signals from a second set of two or more first circuits.

* * * * *